United States Patent
Reznicek et al.

(10) Patent No.: US 10,886,403 B2
(45) Date of Patent: *Jan. 5, 2021

(54) CLOSE PROXIMITY AND LATERAL RESISTANCE REDUCTION FOR BOTTOM SOURCE/DRAIN EPITAXY IN VERTICAL TRANSISTOR DEVICES

(71) Applicant: ELPIS TECHNOLOGIES INC., Ottawa (CA)

(72) Inventors: Alexander Reznicek, Troy, NY (US); Shogo Mochizuki, Clifton Park, NY (US); Jingyun Zhang, Albany, NY (US); Xin Miao, Slingerlands, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,812

(22) Filed: Aug. 28, 2019

(65) Prior Publication Data

US 2019/0393343 A1  Dec. 26, 2019

Related U.S. Application Data

(63) Continuation of application No. 15/888,745, filed on Feb. 5, 2018, now Pat. No. 10,439,063.

(51) Int. Cl.
*H01L 29/78* (2006.01)
*H01L 29/66* (2006.01)
(Continued)

(52) U.S. Cl.
CPC .... *H01L 29/7827* (2013.01); *H01L 21/26506* (2013.01); *H01L 21/30604* (2013.01);
(Continued)

(58) Field of Classification Search
None
See application file for complete search history.

(56) References Cited

U.S. PATENT DOCUMENTS 9,935,102 B1    4/2018    Bi et al.
10,439,063 B2 * 10/2019  Reznicek ............ H01L 29/7827
(Continued)

OTHER PUBLICATIONS

List of IBM Patents or Patent Applications Treated as Related dated Aug. 28, 2019, 2 pages.

*Primary Examiner* — Zandra V Smith
*Assistant Examiner* — Lawrence C Tynes, Jr.
(74) *Attorney, Agent, or Firm* — Scully Scott Murphy and Presser

(57) ABSTRACT

A self-limiting etch is used to provide a semiconductor base located between a semiconductor substrate and a semiconductor fin. The semiconductor base has an upper portion, a lower portion and a midsection. The midsection has a narrower width than the lower and upper portions. A bottom source/drain structure is grown from surfaces of the semiconductor substrate and the semiconductor base. The bottom source/drain structure has a tip region that contacts the midsection of the semiconductor base. The bottom source/drain structures on each side of the semiconductor fin are in close proximity to each other and they have increased volume. Reduced access resistance may also be achieved since the bottom source/drain structure has increased volume.

20 Claims, 15 Drawing Sheets

(51) Int. Cl.
 *H01L 21/265* (2006.01)
 *H01L 21/306* (2006.01)
 *H01L 29/417* (2006.01)
 *H01L 29/08* (2006.01)
 *H01L 29/10* (2006.01)

(52) U.S. Cl.
 CPC .... *H01L 21/30608* (2013.01); *H01L 29/0847* (2013.01); *H01L 29/1037* (2013.01); *H01L 29/41741* (2013.01); *H01L 29/6653* (2013.01); *H01L 29/6656* (2013.01); *H01L 29/66666* (2013.01)

(56) References Cited

U.S. PATENT DOCUMENTS

| | | | | |
|---|---|---|---|---|
| 2007/0082448 | A1* | 4/2007 | Kim | H01L 27/10876 438/268 |
| 2012/0025286 | A1* | 2/2012 | Nojima | H01L 29/0657 257/296 |
| 2014/0264754 | A1* | 9/2014 | Surthi | H01L 29/04 257/607 |
| 2015/0187909 | A1* | 7/2015 | Yan | H01L 21/76224 438/424 |
| 2017/0373058 | A1* | 12/2017 | Tsau | H01L 29/66545 |
| 2018/0122800 | A1* | 5/2018 | Cheng | H01L 21/764 |

* cited by examiner

US 10,886,403 B2

CLOSE PROXIMITY AND LATERAL RESISTANCE REDUCTION FOR BOTTOM SOURCE/DRAIN EPITAXY IN VERTICAL TRANSISTOR DEVICES

BACKGROUND

The present application relates to a semiconductor structure and a method of forming the same. More particularly, the present application relates to a semiconductor structure including a vertical transistor which includes a bottom source/drain structure that is in close proximity to the semiconductor fin and has increased volume, as well as a method of forming such a structure.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for 5 nm and beyond.

In such vertical transistors, the formation of the bottom source/drain structure by epitaxy and subsequent formation of extensions and junctions are challenging. There is a desire to provide a closer proximity for bottom source/drain epitaxy. Additionally, the volume of the bottom source/drain structure in typical prior art vertical transistors is small leading to access resistance far above process assumptions desired. Attempts to form closer proximity and to increase the proximity with anisotropic etching has shown to be very hard to control and may often lead to the collapsing of the semiconductor fins. Also, the volume gain using such processing is rather small. There is thus a need for providing vertical transistors in which the bottom source/drain structure can be fabricated in closer proximity to the semiconductor fins without fin collapsing and with increased volume.

SUMMARY

A self-limiting etch is used to provide a semiconductor base located between a semiconductor substrate and a semiconductor fin. The semiconductor base has an upper portion, a lower portion and a midsection, wherein the midsection has a narrower width than the lower and upper portions. A bottom source/drain structure can be grown from surfaces of the semiconductor substrate and surfaces of semiconductor base. The bottom source/drain structure has a tip region that contacts the midsection of the semiconductor base. Thus, the bottom source/drain structures on each side of the semiconductor fin are in close proximity to each other and they have increased volume. A gate structure can be formed above the bottom source/drain structure and on each side of the at least one semiconductor fin. A top source/drain structure can be provided on a topmost surface of the at least one semiconductor fin. Reduced access contact resistance may also be achieved since the bottom source/drain structure has increased volume.

In one aspect of the present application, a semiconductor structure is provided. In one embodiment, the semiconductor structure includes at least one semiconductor fin extending upwards from a semiconductor base of a semiconductor substrate, wherein the semiconductor base comprises an upper portion, a lower portion and a midsection, wherein the midsection has a narrower width than the lower and upper portions. A bottom source/drain structure is located on surfaces of the semiconductor substrate and surfaces of semiconductor base. The bottom source/drain structure has a tip region that contacts the midsection of the semiconductor base. A gate structure is located above the bottom source/drain structure and on each side of the at least one semiconductor fin. A top source/drain structure is located on a topmost surface of the at least one semiconductor fin.

In another aspect of the present application, a method of forming a semiconductor structure is provided. In one embodiment, the method includes forming at least one semiconductor fin extending upwards from a semiconductor substrate, wherein a dielectric spacer is present on each sidewall surface of the at least one semiconductor fin and a hard mask is located on a topmost surface of the at least one semiconductor fin. The semiconductor substrate is then recessed to provide a semiconductor pedestal beneath the dielectric spacer and the at least one semiconductor fin. Next, a self-limiting etch is performed to convert at least the semiconductor pedestal into a semiconductor base comprising an upper portion, a lower portion and a midsection, wherein the midsection has a narrower width than the lower and upper portions. A bottom source/drain structure is then formed on physically exposed surfaces of the semiconductor base and the semiconductor substrate. Each dielectric spacer is then removed from length-wise sidewalls of the at least one semiconductor fin, and thereafter a gate structure is formed above the bottom source/drain structure and on each side of the at least one semiconductor fin. The hard mask is then removed from the at least one semiconductor fin and thereafter a top source/drain structure is formed on a topmost surface of the at least one semiconductor fin.

DETAILED DESCRIPTION

Figure 1A:
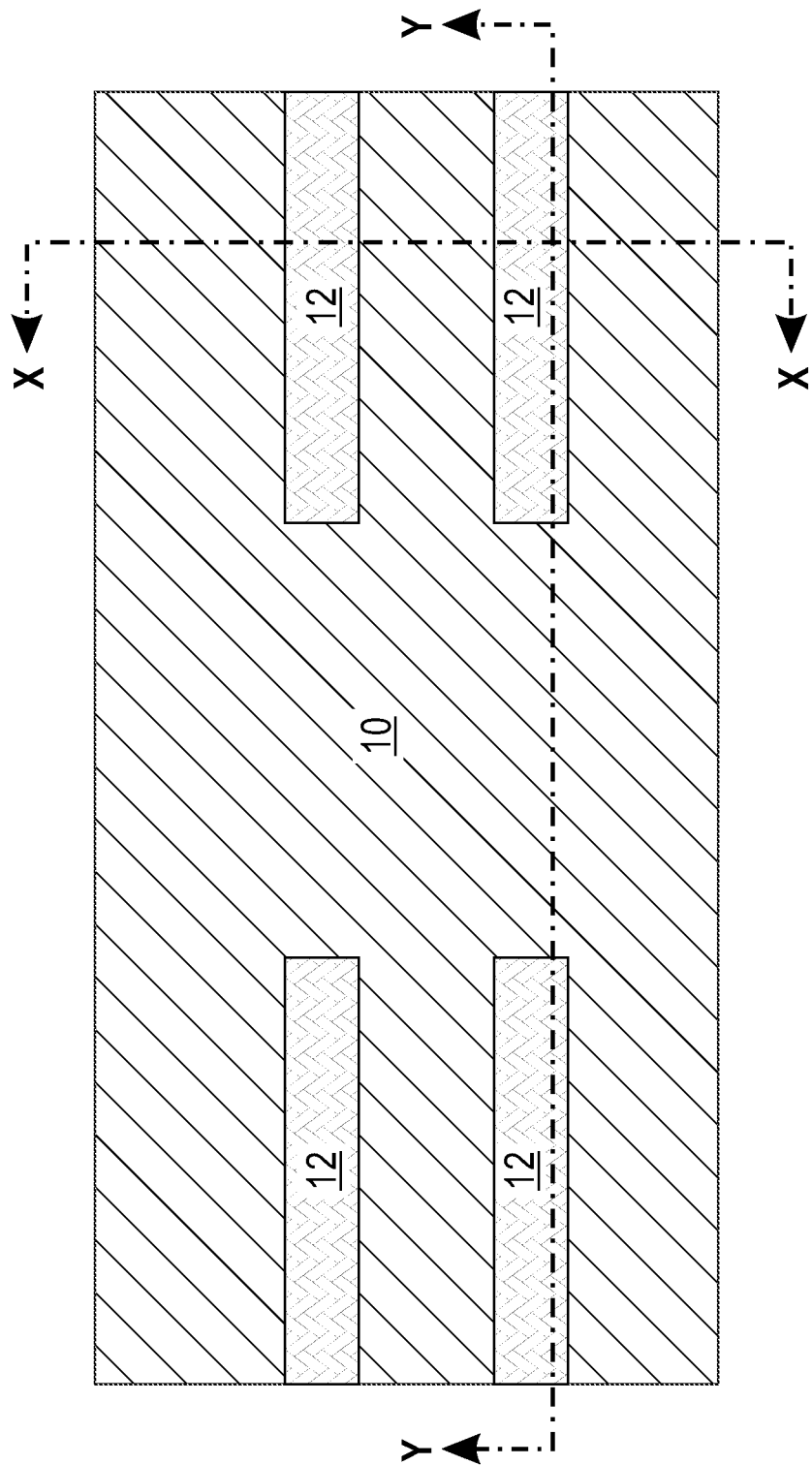
FIG. 1A is a top down view of an exemplary semiconductor structure that includes a plurality of spaced apart hard masks located on a topmost surface of a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
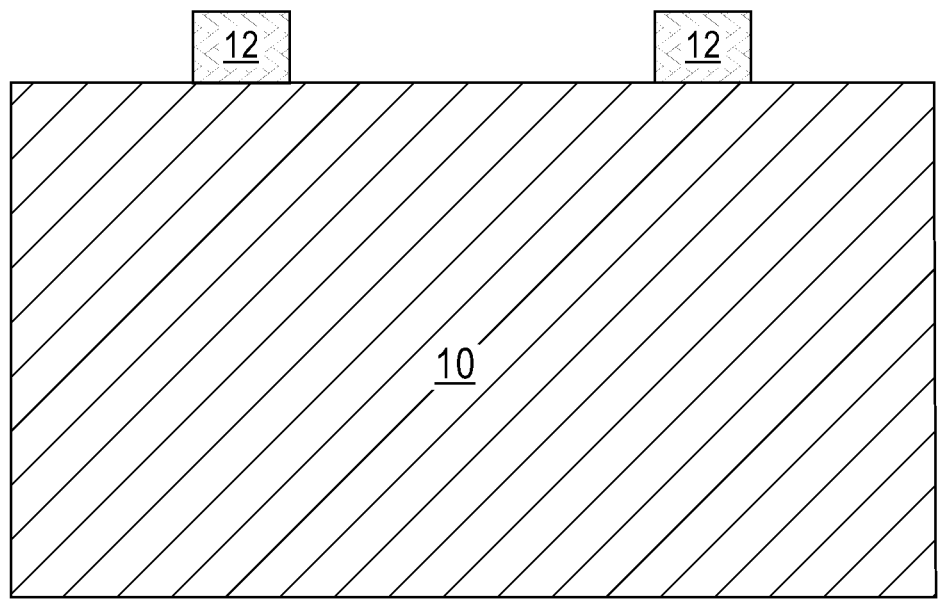
FIG. 1B is a cross sectional view of the exemplary semiconductor structure of FIG. 1A through x-x; x-x is a cross sectional view across, and along the width-wise direction of, the semiconductor fins.
Figure 1C:
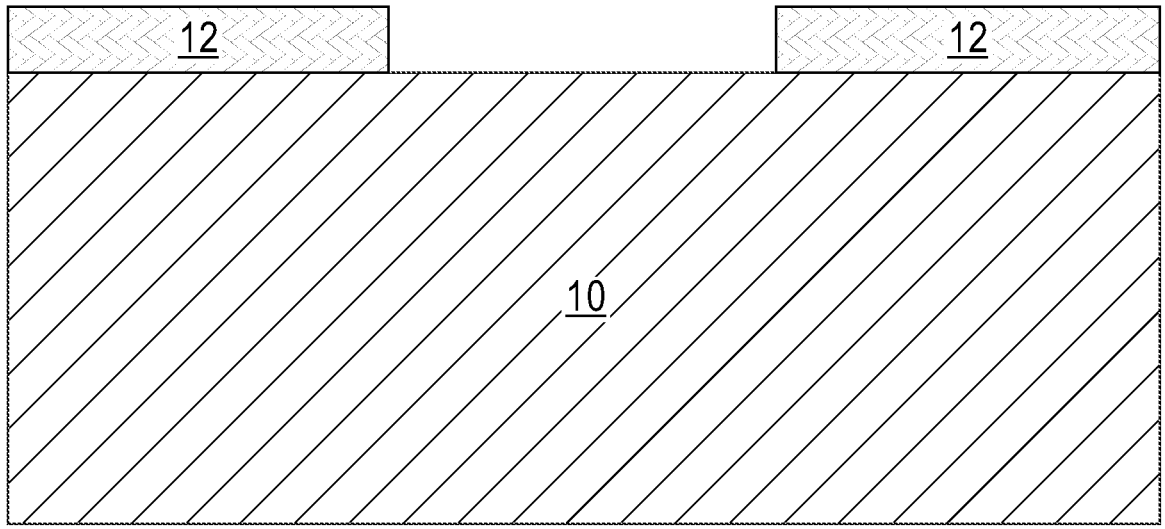
FIG. 1C is a cross sectional view of the exemplary semiconductor structure of FIG. 1A though y-y; y-y is a cross sectional view parallel to, and along the length-wise direction of, the semiconductor fins.

Referring first to FIGS. 1A, 1B and 1C, there are illustrated various views of an exemplary semiconductor structure that can be employed in accordance with an embodiment of the present application. The exemplary structure shown in FIGS. 1A, 1B and 1C includes a plurality of spaced apart hard masks 12 located on a topmost surface of a semiconductor substrate 10.

In one embodiment of the present application, the semiconductor substrate 10 that can be employed in the present application is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the semiconductor substrate 10 may be a single crystalline semiconductor material. The semiconductor material that provides the semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The plurality of spaced apart hard masks 12 that can be employed in the present application are composed of a dielectric hard mask material such as, for example, silicon dioxide, silicon nitride and/or silicon oxynitride. In one embodiment, silicon nitride is employed as the dielectric hard mask material that provides each of the hard masks 12. The plurality of spaced apart hard masks 12 can be formed by first providing a dielectric hard mask material layer on the topmost surface of the semiconductor substrate 10. The dielectric hard mask material layer may be formed utilizing a deposition process such as, for example, chemical vapor deposition (CVD) or plasma enhanced chemical vapor deposition (PECVD). In some embodiments, the dielectric hard mask material layer may be formed by a thermal growth process such as, for example, thermal oxidation and/or thermal nitridation. In yet other embodiments, the dielectric hard mask material layer may be formed utilizing a combination of, and in any order, a deposition process and a thermal growth process. The dielectric hard mask material layer is a continuous layer (without any breaks or gaps) whose thickness may be from 20 nm to 100 nm. Other thicknesses that are lesser than, or greater than the aforementioned thicknesses values may also be employed as the thickness of the dielectric hard mask material layer.

After providing the dielectric hard mask material layer, the dielectric hard mask material layer is patterned to provide spaced apart hard masks 12 located on the topmost surface of the semiconductor substrate 10. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. The patterned photoresist is typically removed from the structure immediately after the pattern has been transferred into the dielectric hard mask material layer. In other embodiments (not shown), the patterned photoresist is removed from the structure after the pattern has been transferred into both the dielectric hard mask material layer and the semiconductor substrate 10. In either embodiment, the patterned photoresist may be removed utilizing a conventional photoresist stripping process such as, for example, ashing.

In another embodiment, the patterning of the dielectric hard mask material layer may include a sidewall image transfer (SIT) process; in some embodiments, the SIT process also patterns the underlying semiconductor substrate 10. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask material layer may include a direct self-assembly (DSA) process in which a copolymer that is capable of direct self-assembly is used. In some embodiments, the DSA process also patterns the underlying semiconductor substrate 10.

Figure 2A:
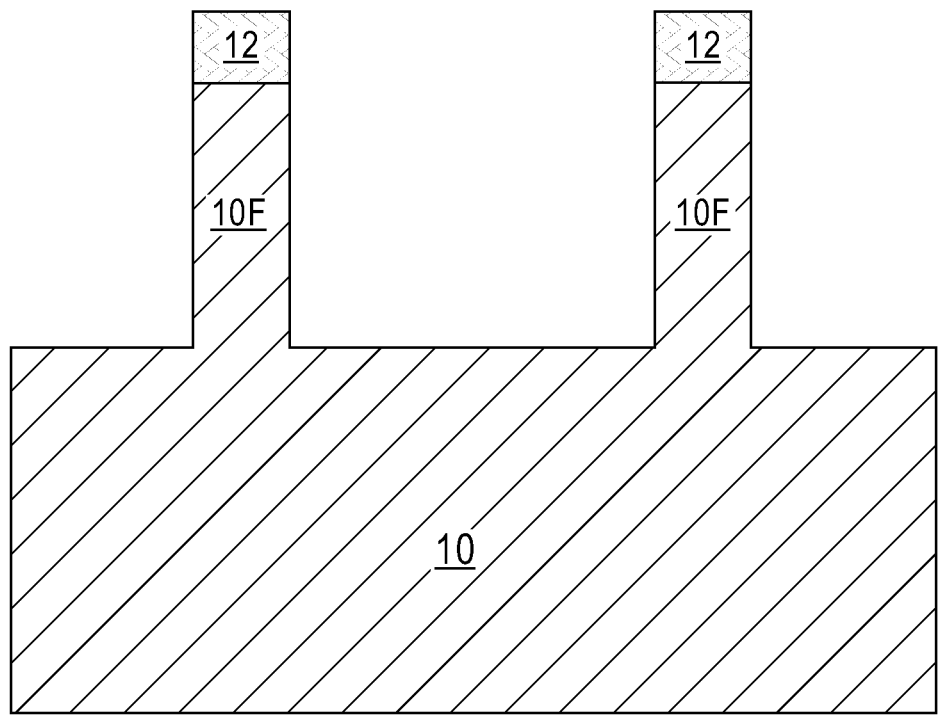
FIG. 2A is a cross sectional view of the exemplary semiconductor structure of FIG. 1B after forming a plurality of semiconductor fins.
Figure 2B:
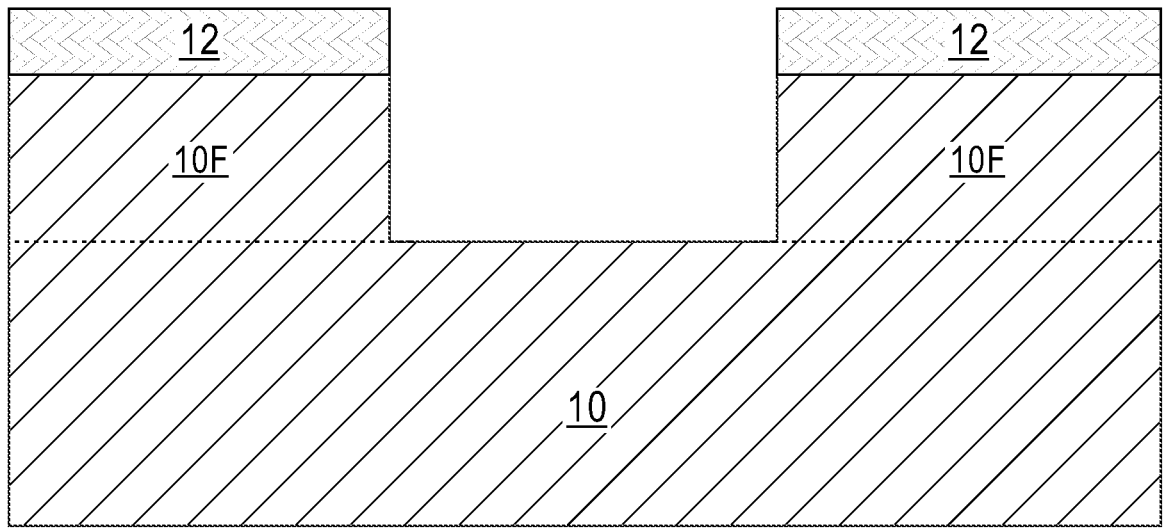
FIG. 2B is a cross sectional view of the exemplary semiconductor structure of FIG. 1C after forming a plurality of semiconductor fins.

Referring now to FIGS. 2A-2B, there are illustrated the exemplary semiconductor structure of FIGS. 1A-1C after forming a plurality of semiconductor fins 10F. Although the present application describes and illustrates forming a plurality of semiconductor fins 10F, a single semiconductor fin 10F can be formed herein.

The forming of the plurality of semiconductor fins 10F may occur simultaneous with the patterning of the dielectric hard mask material layer or after the patterning of the dielectric hard mask material layer. The forming of the plurality of semiconductor fins 10F includes one of the etching processes mentioned above in providing the plurality of hard masks 12. The forming of the plurality of semiconductor fins 10F utilizes the hard masks 12 as an etch mask.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 10F has a height from 20 nm to 200 nm, and a width from 5 nm to 30 nm. Other heights and/or widths that are lesser than, or greater than, the ranges mentioned herein can also be used in the present application. Each semiconductor fin 10F is spaced apart from its nearest neighboring semiconductor fin 10F by a pitch of from 20 nm to 100 nm; the pitch is measured from one point of one semiconductor fin to the exact point on a neighboring semiconductor fin. Also, each semiconductor fin 10F is oriented parallel to each other. An opening or gap is present between each neighboring pairs of semiconductor fins 10F.

As is shown, each semiconductor fin 10F extends upwards from a remaining portion of the semiconductor substrate 10. In some embodiments, and when the semiconductor substrate 10 is composed of a single semiconductor material, there is no material interface present between the semiconductor fins 10F and the remaining portion of the semiconductor substrate 10.

Figure 3A:
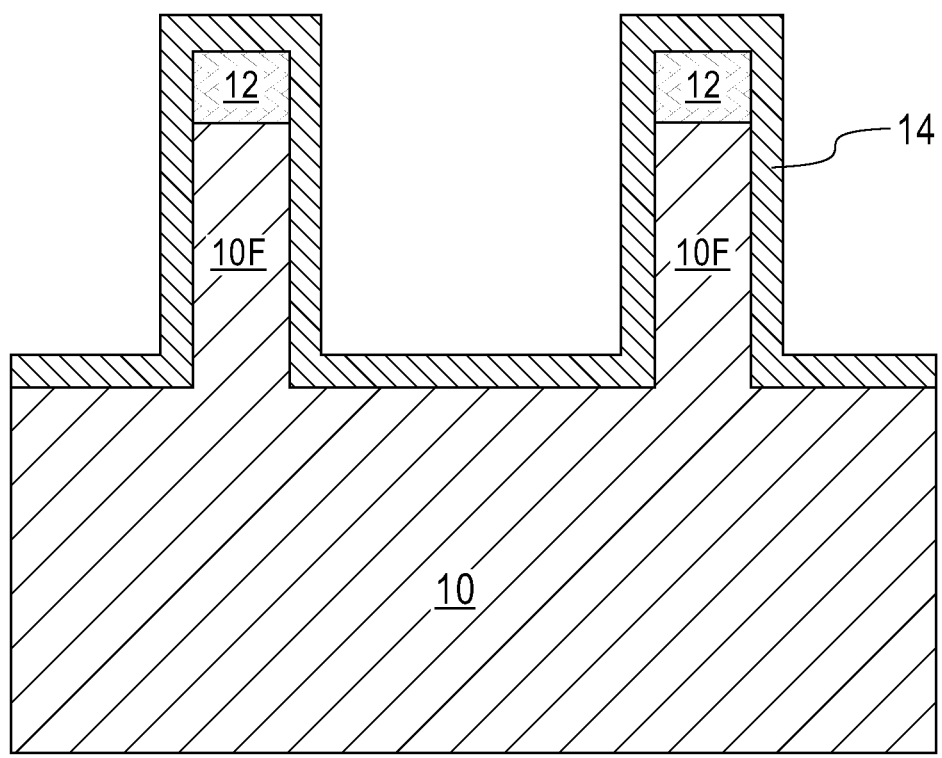
FIG. 3A is a cross sectional view of the exemplary semiconductor structure of FIG. 2A after forming a dielectric spacer material layer.
Figure 3B:
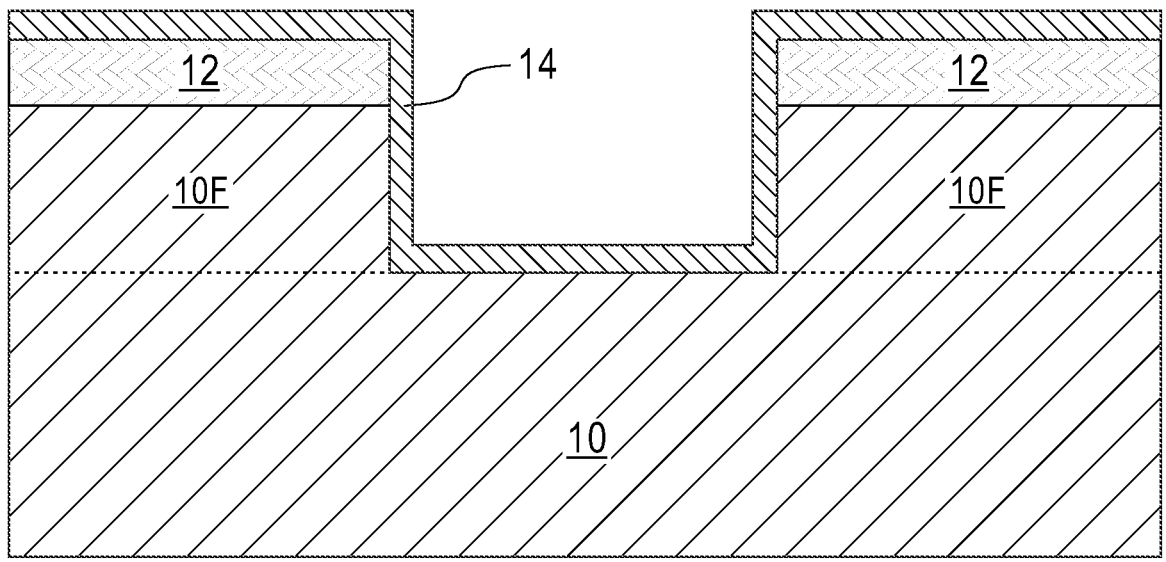
FIG. 3B is a cross sectional view of the exemplary semiconductor structure of FIG. 2B after forming a dielectric spacer material layer.

Referring now to FIGS. 3A-3B, there are illustrated the exemplary semiconductor structure of FIGS. 2A-2B after forming a dielectric spacer material layer 14. The dielectric spacer material layer 14 is a continuous material layer that is formed on physically exposed surfaces of each semiconductor fin 10F, each hard mask 12, and a remaining portion of the semiconductor substrate 10.

The dielectric spacer material layer 14 may be composed of any dielectric spacer material including for example, silicon dioxide, silicon nitride or silicon oxynitride. The dielectric spacer material may be the same as, or different from, the dielectric hard mask material that provides each hard mask 12. The dielectric spacer material layer 14 may be formed utilizing a deposition process such as, for example, chemical vapor deposition, plasma enhanced chemical vapor deposition or atomic layer deposition (ALD). In one example, the dielectric spacer material layer 14 is composed of silicon nitride that is formed by ALD. The dielectric spacer material layer 14 may be a conformal layer having a thickness from 5 nm to 20 nm; other thicknesses are contemplated and can be used as the thickness of the dielectric spacer material layer 14.

Figure 4A:
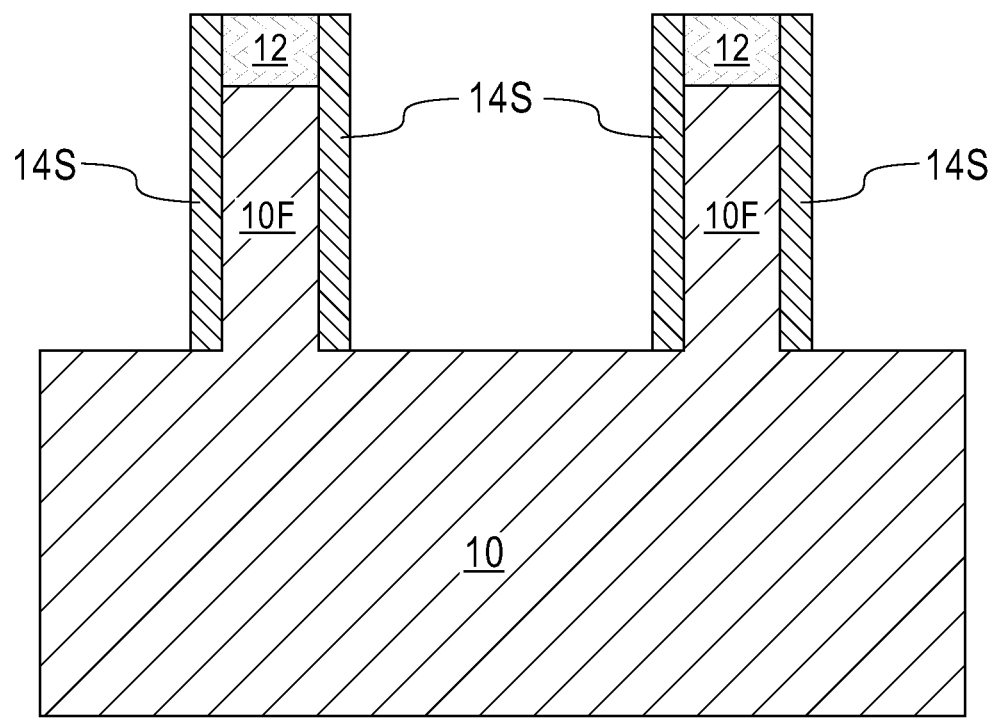
FIG. 4A is a cross sectional view of the exemplary semiconductor structure of FIG. 3A after etching the dielectric spacer material layer to form a dielectric spacer on sidewall surfaces of each semiconductor fin.
Figure 4B:
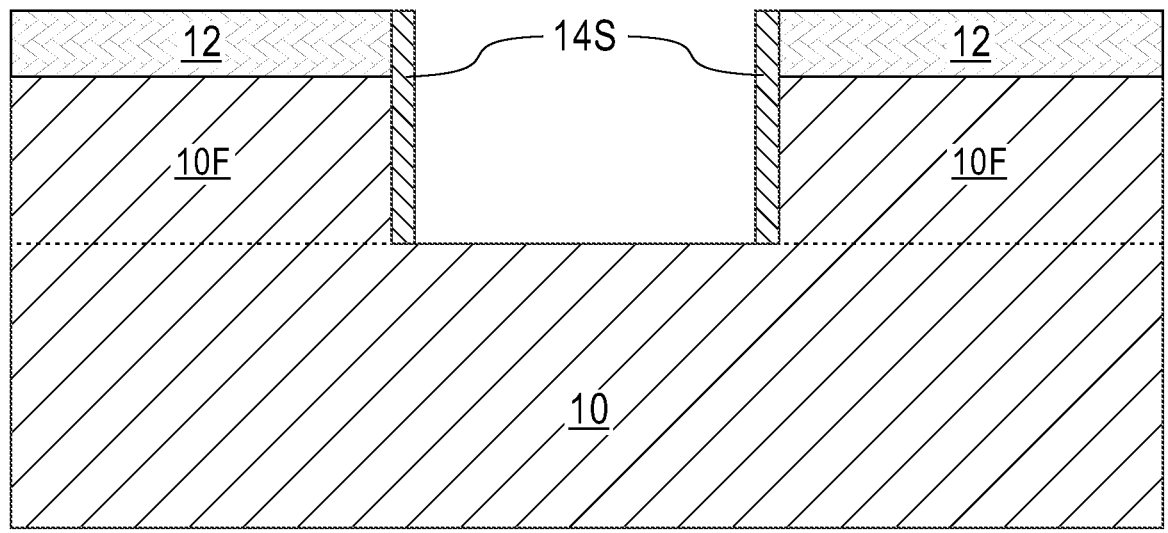
FIG. 4B is a cross sectional view of the exemplary semiconductor structure of FIG. 3B after etching the dielectric spacer material layer to form a dielectric spacer on sidewall surfaces of each semiconductor fin.

Referring now to FIGS. 4A-4B, there are illustrated the exemplary semiconductor structure of FIGS. 3A-3B after etching the dielectric spacer material layer 14 to form a dielectric spacer 14S on sidewall surfaces of each semiconductor fin 10F; the dielectric spacers 14 may also extend to the topmost surface of each hard mask 12 thus covering the sidewall surfaces of each hard mask 12. As is shown, each dielectric spacer 14S has a bottommost surface that directly contacts a remaining portion of the semiconductor substrate 10 that is present at the footprint of each semiconductor fin 10F. Each dielectric spacer 14S may have a topmost surface that is coplanar with, or slightly beneath, the topmost surface of each hard mask 12. The etching process that can be used to provide the dielectric spacers 14S may include any well known dielectric spacer etch such as, for example, reactive ion etching.

Figure 5A:
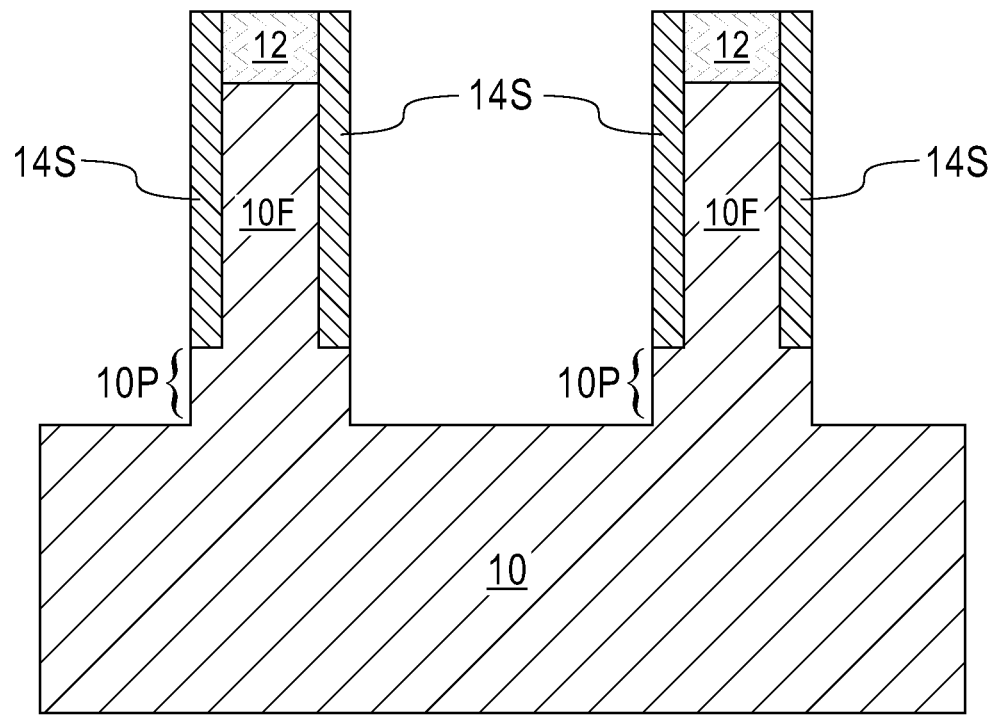
FIG. 5A is a cross sectional view of the exemplary semiconductor structure of FIG. 4A after recessing the semiconductor substrate.
Figure 5B:
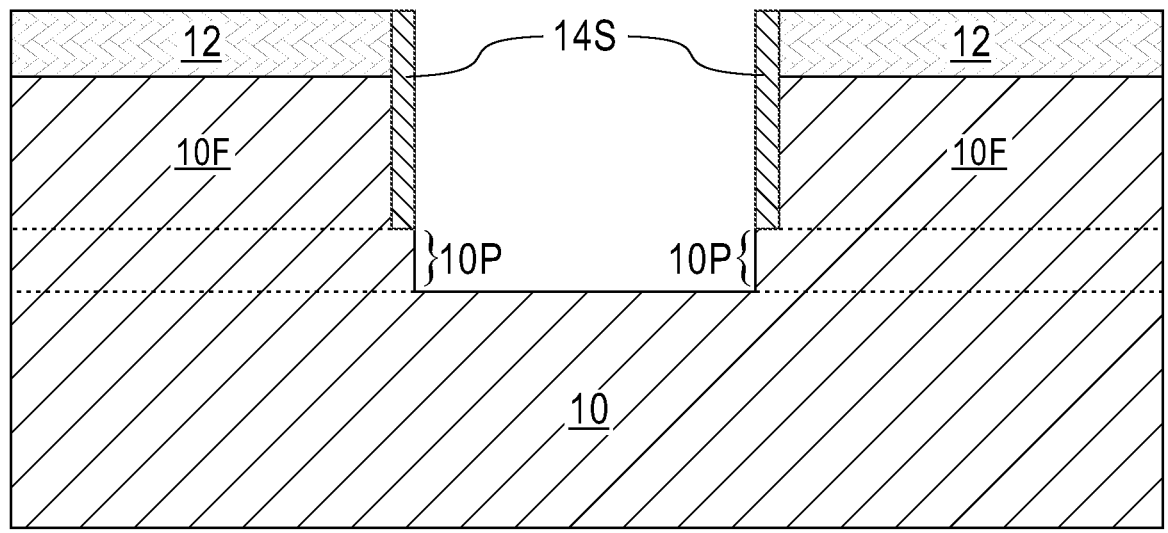
FIG. 5B is a cross sectional view of the exemplary semiconductor structure of FIG. 4B after recessing the semiconductor substrate.

Referring now to FIGS. 5A-5B, there are shown the exemplary semiconductor structure of FIGS. 4A-4B after recessing the semiconductor substrate 10. The recessing may be performed utilizing a recessing etching process that is selective in removing semiconductor material as compared to a dielectric material. In one example, the recess etch may be a reactive ion etching process. The recessing of the semiconductor substrate 10 provides a semiconductor pedestal 10P that has sidewall surfaces that are vertically aligned to the outermost sidewall surfaces of the dielectric spacer 14S. As is shown, each semiconductor pedestal 10P is present on a remaining portion of the semiconductor substrate 10, and a dielectric spacer 14S and a semiconductor fin 10F are present on each semiconductor pedestal 10P.

The distance of the recess etch, as measured from a topmost surface of a semiconductor pedestal 10P to a bottommost surface of the semiconductor pedestal 10P, defines the tip position and proximity of the bottom source/drain structure to be subsequently formed.

Figure 6A:
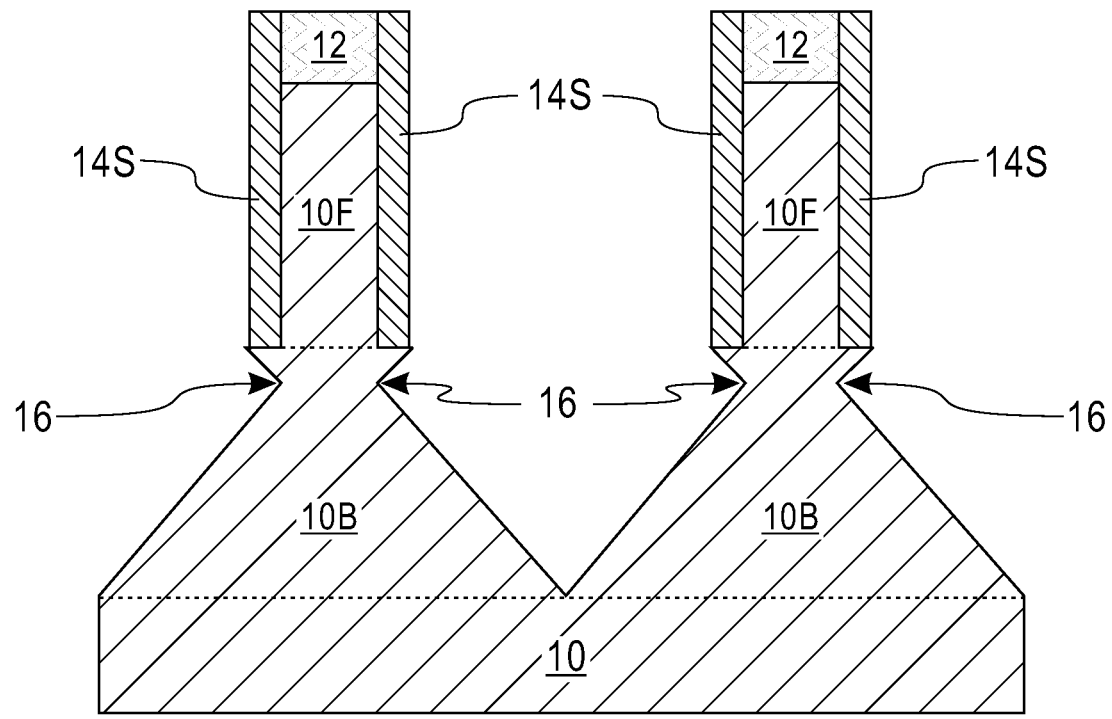
FIG. 6A is a cross sectional view of the exemplary semiconductor structure of FIG. 5A after performing a self-limiting etch.
Figure 6B:
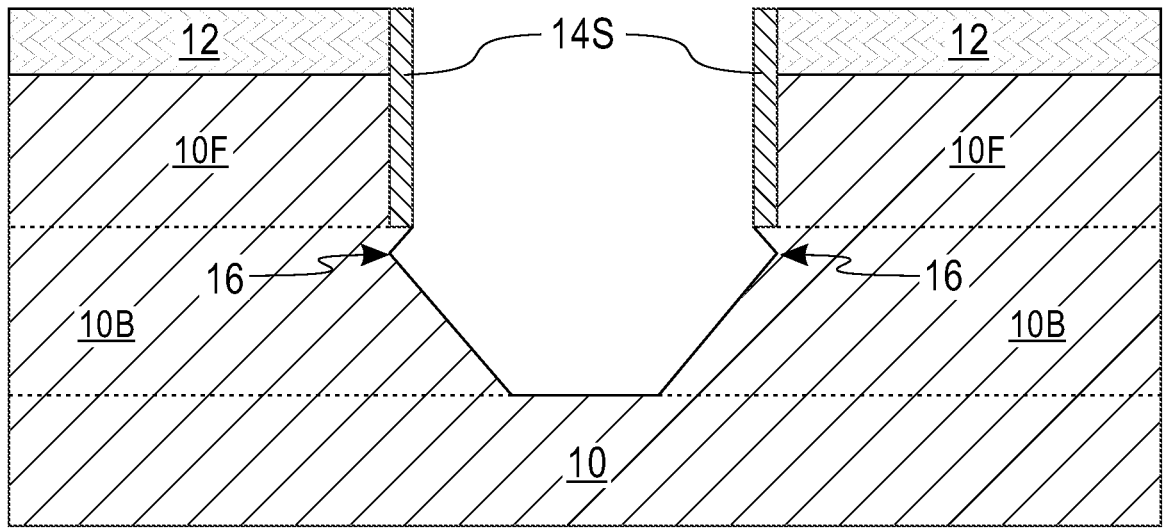
FIG. 6B is a cross sectional view of the exemplary semiconductor structure of FIG. 5B after performing a self-limiting etch.

Referring now to FIGS. 6A-6B, there are shown the exemplary semiconductor structure of FIGS. 5A-5B after performing a self-limiting etch. The self-limiting etch provides a semiconductor base 10B that is present on a remaining portion of semiconductor substrate 10. The self-limiting etch converts at least the semiconductor pedestal 10P (and sometimes a remaining portion of the semiconductor substrate 10) into the semiconductor base 10B. In this embodiment, the semiconductor base 10B includes portions of the semiconductor pedestal 10P and portions of the previous remaining portions of the semiconductor substrate 10 that were not subjected to the recess etch described above. The semiconductor base 10B is hour-glass shaped. By "hourglass shaped" it is meant a structure that has an upper portion and a lower portion that are connected by midsection that is narrower (in terms of its width) than either the upper and lower portions. In the drawing, element 16 denotes the midsection of the semiconductor base 10B that is formed by the self-limiting etching. As is shown, a dielectric spacer 14S and a semiconductor fin 10F are present on each semiconductor base 10B. The semiconductor base 10B has faceted sidewalls and the recessed formed at the midsection extends beneath the gate spacer 14S.

The term "self-limiting etch" is used throughout the present application to denote an etch that removes certain planes of a material faster than other planes of the same material. For example, a self-limiting etch of silicon removes {100} and/or {110} planes faster than {111} planes. The self-limiting etch may also be referred to herein as a crystallographic etch. One example of a self-limiting etch is a sigma etch. Some illustrative examples of etchants that may be used during the self-limiting etch include tetramethylammonium hydroxide (TMAH), ammonia (NH$_4$OH), and/or potassium hydroxide (KOH). In the present application, the self-limiting etch prevents collapsing of the semiconductor fins 10F, while providing closer proximity and more space for the bottom source/drain structures to be subsequently formed.

Figure 7:
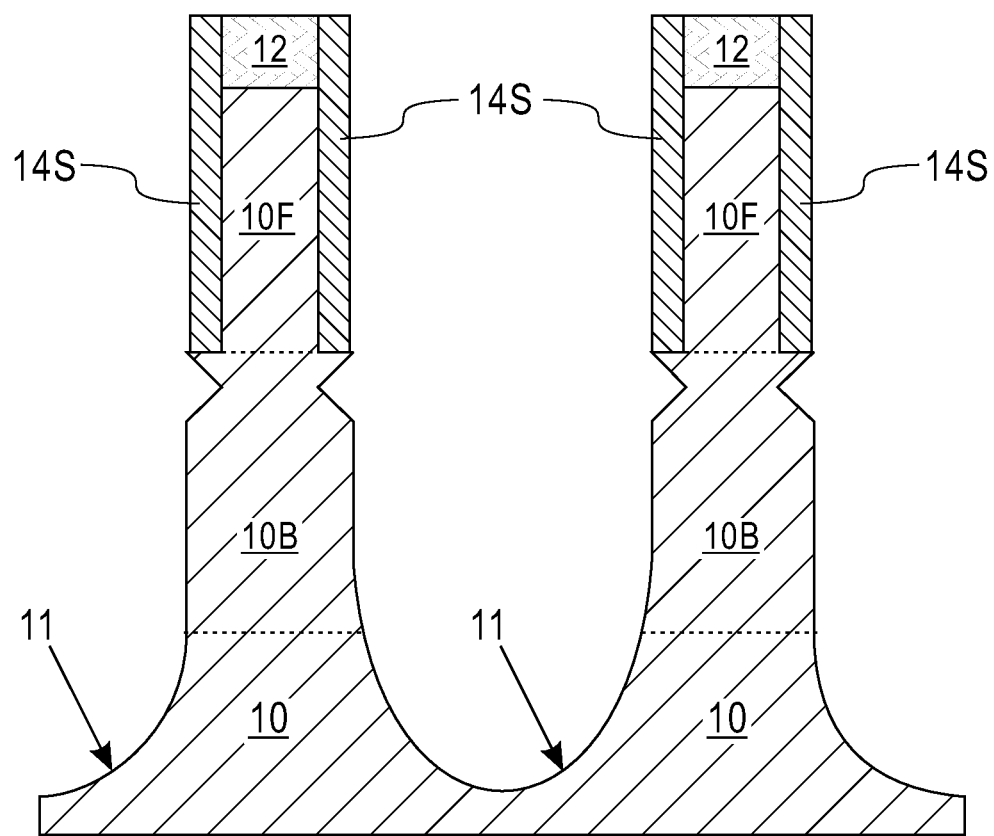
FIG. 7 is a cross sectional view of the exemplary semiconductor structure of FIG. 6A after performing a second recessing of the semiconductor substrate.

Referring now to FIG. 7, there is shown the exemplary semiconductor structure of FIG. 6A after performing a second recessing of the remaining portions of the semiconductor substrate 10 so as to provide the remaining portion of the semiconductor substrate 10 with a concave, i.e., rounded, surface 11. In some embodiments, this step of the present application may be omitted. When performed, the second recessing can provide an increased volume in which the bottom source/drain structure can be subsequently formed.

The second recessing of the remaining portion of the semiconductor substrate 10 may be performed utilizing the recess etch mentioned above in providing the exemplary semiconductor structure shown in FIGS. 5A and 5B. In one example, the second recessing may include a reactive ion etch.

Figure 8:
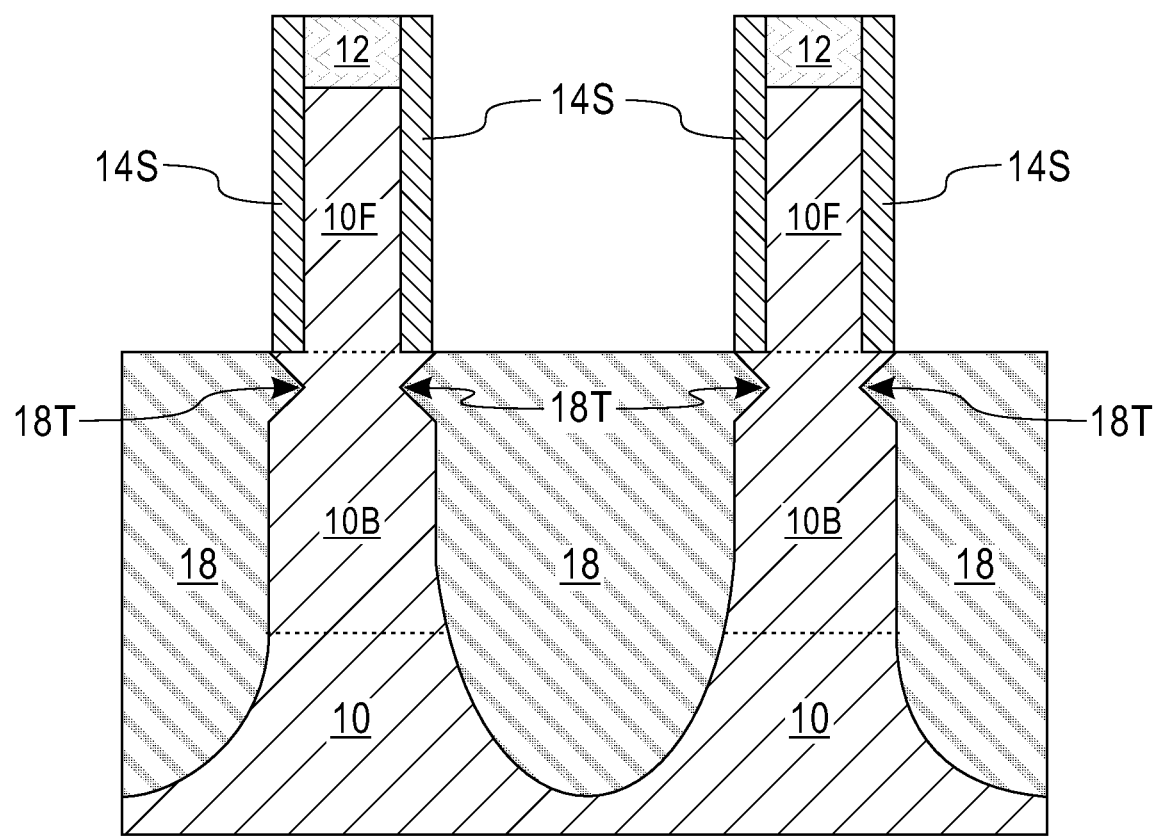
FIG. 8 is a cross sectional view of the exemplary semiconductor structure of FIG. 7 after formation of the bottom source/drain structure.

Referring now to FIG. 8, there are shown the exemplary semiconductor structure of FIG. 7 after formation of the bottom source/drain structure 18. The bottom source/drain structure 18 is formed on the exposed surfaces of the semiconductor base 10B and the remaining portion of the semiconductor substrate 10.

The bottom source/drain structure 18 includes a semiconductor material and an n-type dopant or a p-type dopant. The semiconductor material that provides the bottom source/drain structure 18 may be the same as, or different from, the semiconductor material of semiconductor substrate 10. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of dopant (i.e., n-type or p-type) within the semiconductor material that provides the bottom source/drain structure 18 can range from $1\times10^{20}$ atoms/cm$^3$ to $2\times10^{21}$ atoms/cm$^3$, although dopant concentrations greater than $2\times10^{21}$ atoms/cm$^3$ or lesser than $1\times10^{20}$ atoms/cm$^3$ are also conceived.

The bottom source/drain structure 18 can be formed utilizing an epitaxial growth (or deposition) process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the bottom source/drain structure 18 has an epitaxial relationship with the physically exposed surface of the semiconductor base 10B and the remaining portion of the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined above) is typically added to the precursor gas or gas mixture.

Since the midsection 16 of the semiconductor base 10B that is formed by the self-limiting etching is narrower than the upper and lower portions of the semiconductor base 10B, the resultant bottom source/drain structures 18 that are formed on opposing sides of a semiconductor fin 10F have tip regions 18T that are in closer proximity to each other than conventional processes in which no self-limiting etch has been performed to provide the hourglass shaped semiconductor base 10B. Also, increased volume of the bottom source/drain structures 18 is provided.

Figure 9A:
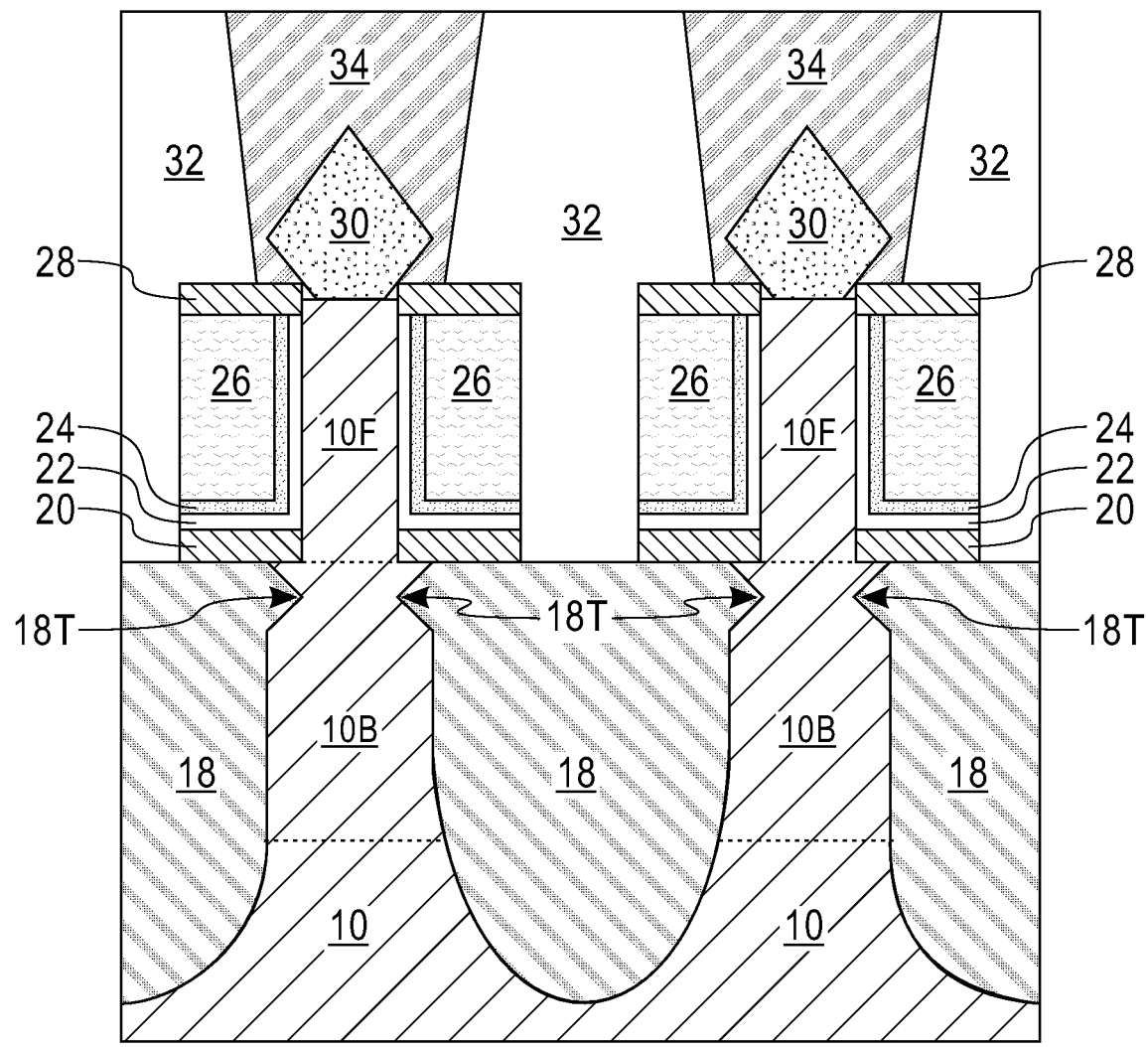
FIG. 9A is a cross sectional view of the exemplary semiconductor structure of FIG. 8 after forming additional components of a vertical transistor.
Figure 9B:
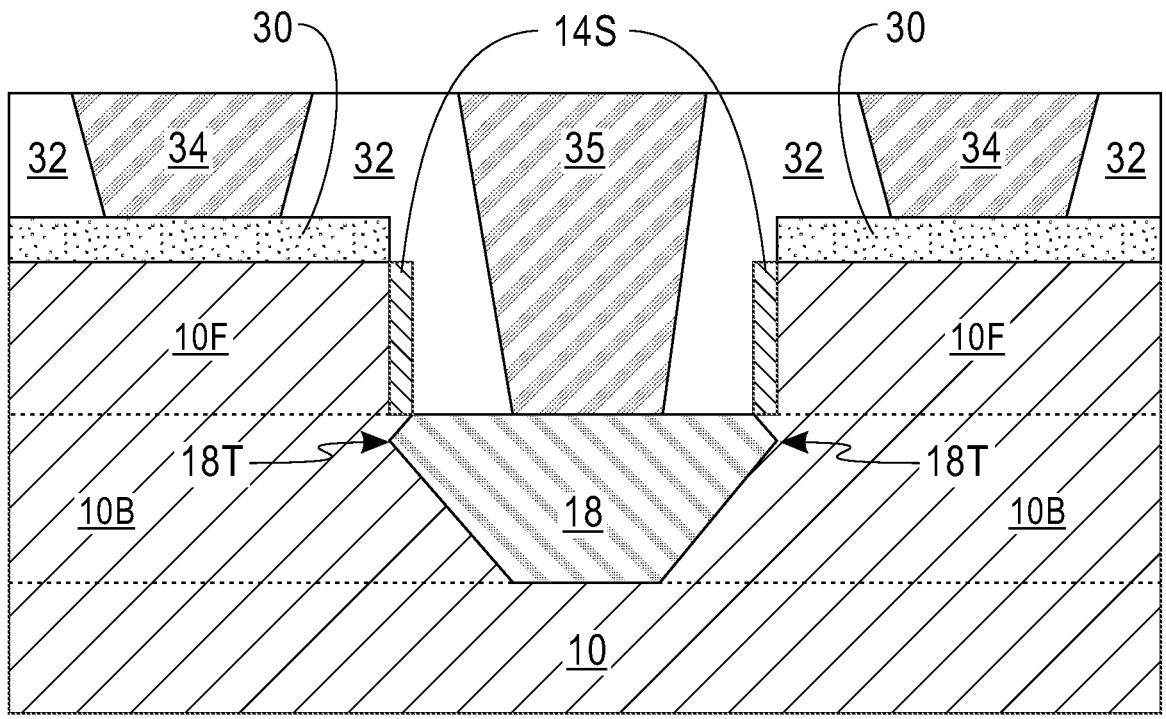
FIG. 9B is a cross sectional view of the exemplary semiconductor structure of FIG. 8 after forming additional components of a vertical transistor and though y-y.

Referring now to FIGS. 9A-9B, there are shown the exemplary semiconductor structure of FIG. 8 after forming additional components of a vertical transistor. The additional components of the vertical transistor include a bottom spacer 20, a gate structure comprising a gate dielectric material layer 22, an optional work function metal layer 24, and a gate conductor 26, a top spacer 28, a top source/drain structure 30, a middle-of-the line dielectric (MOL) dielectric material 32 and a top source/drain contact structure 34; FIG. 9B which is a cross section though y-y also shows the presence of a bottom source/drain contact structure 35.

The additional components of the vertical transistor can be formed utilizing materials and techniques that are well known to those skilled in the art. For example, the additional components of the vertical transistor may be formed by first removing the dielectric spacer 14S from the length-wise sidewalls of the semiconductor fins 10F, dielectric spacer 14S remains on the width-wise sidewalls of each semiconductor fin 10F; see for example FIG. 9B. The dielectric spacer 14S may be removed utilizing an etch that is selective for removing the dielectric spacer material that provides the dielectric spacer 14S. The removal of the dielectric spacer 14S from the length-wise sidewalls of the semiconductor fins 10 physically exposes those sidewalls of the semiconductor fins 10F.

Bottom spacer 20 can then be formed. The bottom spacer 20 contacts the physically exposed sidewalls of the lower portion of the semiconductor fins 10F. The bottom spacer 20 may be composed of any dielectric spacer material including, for example, silicon dioxide, silicon nitride or silicon oxynitride. The bottom spacer 22 may be formed utilizing a deposition process such as, for example, chemical vapor deposition or plasma enhanced chemical vapor deposition. In some instances, an etch back process may follow the deposition of the dielectric spacer material that provides the bottom spacer 20. The bottom spacer 20 may have a thickness from 5 nm to 15 nm. Other thicknesses that are lesser than, or greater than, the aforementioned thickness range may also be employed in the present application as the thickness of the bottom spacer 20 as long as the height of the bottom spacer 20 is not greater than the height of the semiconductor fins 10F and there is sufficient area on each the semiconductor fins 10F to form the other components of the vertical transistor.

The gate structure is then formed. As mentioned above, the gate structure may include a gate dielectric material layer 22, an optional work function metal layer 24, and a gate conductor 26. As is shown, the gate dielectric material layer 22 directly contacts a portion of the physically exposed sidewalls of the semiconductor fins 10F. The gate dielectric material layer 22 may be composed of a gate dielectric material such as, for example, an oxide, nitride, and/or oxynitride. In one example, the gate dielectric material layer 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as gate dielectric material layer 22. The gate dielectric material that provides the gate dielectric material layer 22 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material that provides the gate dielectric material layer 22 can have a thickness in a range from 1 nm to 10 nm. Other thicknesses that are lesser than, or greater than, the aforementioned thickness range can also be employed for the gate dielectric material that provides the gate dielectric material layer 22.

Next, the optional work function metal layer 24 can be formed on gate dielectric material layer 22. The work function metal layer 24 may be composed of a p-type work function metal or an n-type work function metal. In the case of a p-type device, the work functional metal layer 24 should effectuate a p-type threshold voltage shift, i.e., a p-type work function metal is employed. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal may be composed of titanium and its nitride or carbide. In one specific embodiment, the p-type work function metal is composed of titanium nitride. The p-type work function metal may also be composed of titanium aluminum nitride, ruthenium, platinum, molybdenum, cobalt, and alloys and combinations thereof.

In an n-type device, the work function metal layer 24 should effectuate an n-type threshold voltage shift; i.e., an n-type work function is used. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of titanium aluminum, tantalum nitride, titanium nitride, hafnium nitride, hafnium silicon, or combinations thereof.

The work function metal layer 24 may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the work function metal that provides the work function metal layer 24 can have a thickness in a range from 1 nm to 10 nm. Other thicknesses that are lesser than, or greater than, the aforementioned thickness range can also be employed for the work function metal that provides the work function metal layer 24.

The gate conductor 26 is then formed on the work function metal layer 24, if present, or on the gate dielectric material layer 22 if the work function metal layer 24 is not present. The gate conductor 26 may be composed of a gate conductor material. The gate conductor material used in providing the gate conductor 26 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate conductor material used in providing the gate conductor 26 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor 26 can have a thickness from 50 nm to 200 nm. Other thicknesses that are lesser than, or greater than, the aforementioned thickness range can also be employed for the gate conductor material used in providing the gate conductor 26.

The gate structure may be removed from an upper sidewall portion of the semiconductor fin 10F. Next, a top spacer 28 is formed; top spacer 28 is formed on a topmost surface of the gate structure and in direct contact with the upper sidewall portion of the semiconductor fins 10F. Top spacer 28 may include one of the materials mentioned above for bottom spacer 20; top spacer 28 is composed of a different dielectric material than the hard masks 12. Top spacer 28 may be formed utilizing one of the deposition processes mentioned above in forming the bottom spacer 20. Top spacer 28 may have a thickness within the thickness range mentioned above for the bottom spacer 20.

A lower portion of the middle-of-the line dielectric (MOL) dielectric material 32 is the formed laterally surrounding each gate structure (22, optionally 24, 26) and each semiconductor fin 10. The lower portion of the MOL dielectric material 32 can be formed by first patterning the gate structure, the bottom spacer 20 and the top spacer 28 by lithography and etching to provide a cavity. The cavity is then filled with the MOL dielectric material 32. The lower portion of the MOL dielectric material 32 has a topmost surface that is coplanar with a topmost surface of the top spacer 28.

The lower portion of the MOL dielectric material 32 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the lower portion of the MOL dielectric material 32. In one embodiment, the lower portion of the MOL dielectric material 32 can be formed utilizing a deposition process including, for example, chemical vapor deposition (CVD), plasma enhanced chemical vapor deposition (PECVD), evaporation or spin-on coating. Following deposition of the lower portion of the MOL dielectric material 32, a planarization process such as chemical mechanical polishing can employed.

At this point of the present application, each hard mask 12 is removed from the topmost surface of each semiconductor fin 10F. Each hard mask 12 can be removed utilizing a material removal process such as, for example, etching or planarization. The removal of each hard mask 12 physically exposes a topmost surface of each semiconductor fin 10F. Next, a top source/drain structure 30 can be formed utilizing an epitaxial growth (or deposition) process, as defined above. In accordance with the present application, the top source/drain structure 30 includes a semiconductor material and either an n-type or p-type dopant. The semiconductor material that provides the top source/drain structure 30 may be the same or different from the semiconductor material of semiconductor substrate 10. The concentration of dopant within the semiconductor material that provides the top source/drain structure 30 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. The top source/drain structure 30 may have a faceted surface. In one example, the top source/drain structure 30 may be diamond shaped.

Additional MOL dielectric material (same or different from the lower portion of the MOL dielectric material 32 mentioned above) is formed to provide an upper portion of the MOL dielectric material 32 as is shown in FIGS. 9A-9B. The upper portion of the MOL dielectric material 32 surrounds the top source/drain structure 30. Contact openings to the top source/drain structures 30 and the bottom source/ drain structures 18 are then formed. A contact metal such as, for example, copper, aluminum, tungsten, cobalt, or alloys thereof is the formed into each contact opening utilizing a deposition process. A planarization process may follow the deposition process. The contact metal or metal alloy within each contact opening is referred to herein as a contact structure; each contact structure designated by element 34 represents a top source/drain contact structure, while each contact structure designated by element 35 represents a bottom source/drain contact structure. As shown in FIGS. 9A-9B, the contact structures (34, 35) have a topmost surface that is coplanar with a topmost surface of the MOL dielectric material 32. It is noted that the bottom source/drain contact structure 35 readily lands on a topmost surface of the bottom source/drain structure 18 due to the increased volume of the bottom source/drain structure 18 that is provided in the present application. As such, the access resistance of the resultant vertical transistor is lower than in conventional vertical transistor structures.

Referring back to FIGS. 9A-9B, there is shown an exemplary semiconductor structure of the present application. Notably, the exemplary structure is a vertical transistor structure that includes at least one semiconductor fin 10F extending upwards from a semiconductor base 10B of a semiconductor substrate 10, wherein the semiconductor base 10B comprises an upper portion, a lower portion and a midsection 16, wherein the midsection 16 has a narrower width than the lower and upper portions. A bottom source/drain structure 18 is located on surfaces of the semiconductor substrate 10 and surfaces of semiconductor base 10. The bottom source/drain structure 18 has a tip region 18T that contacts the midsection 16 of the semiconductor base 10B. A gate structure (22, optionally 24, 26) is located above the bottom source/drain structure 18 and on each side of the at least one semiconductor fin 10. A top source/drain structure 30 is located on a topmost surface of the at least one semiconductor fin 10F.

Figure 10:
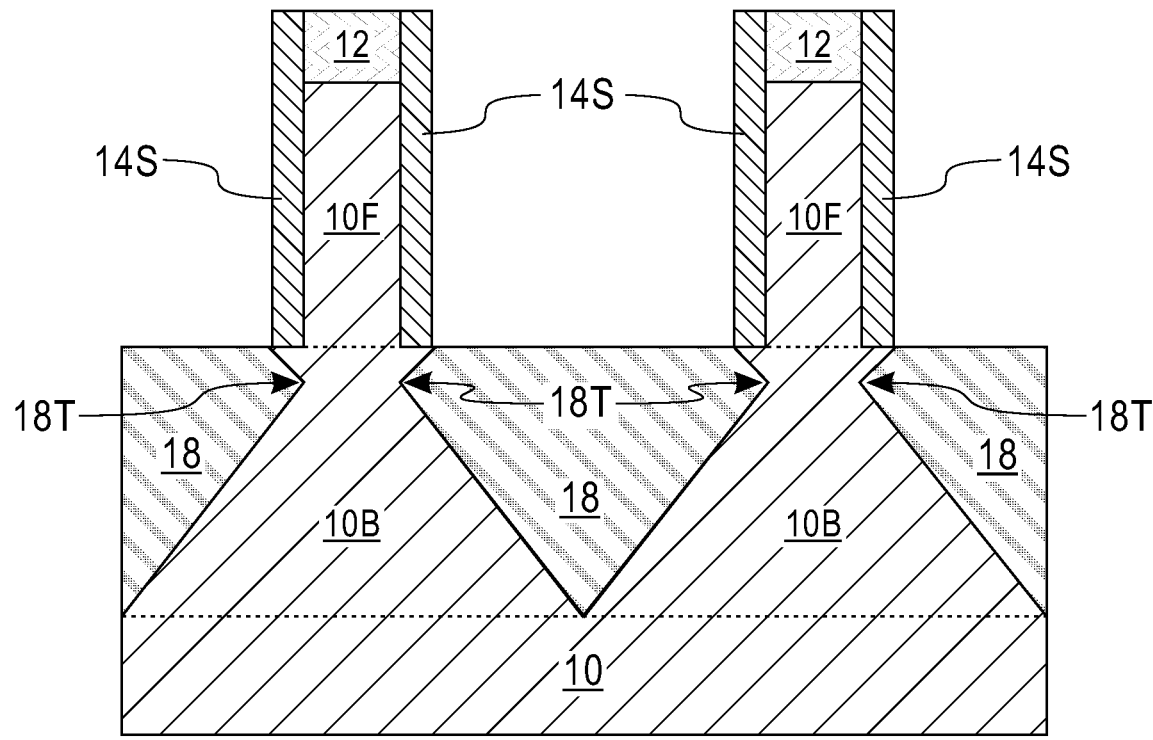
FIG. 10 is a cross sectional view of the exemplary semiconductor structure of FIG. 6A after formation of the bottom source/drain structure in accordance with another embodiment of the present application.

Referring now to FIG. 10, there is illustrated the exemplary semiconductor structure of FIG. 6A after formation of the bottom source/drain structure 18 in accordance with another embodiment of the present application. The bottom source/drain structure 18 of this embodiment of the present application is the same as that described above in FIG. 8 of the present application. Thus, the bottom source/drain structure 18 of this embodiment of the present application includes a semiconductor material and dopant as described above in the previous embodiment of the present application. The bottom source/drain structure 18 of this embodiment of the present application can be formed utilizing an epitaxial growth process as described above for forming the bottom source/drain structure 18 in the previous embodiment of the present application.

Figure 11:
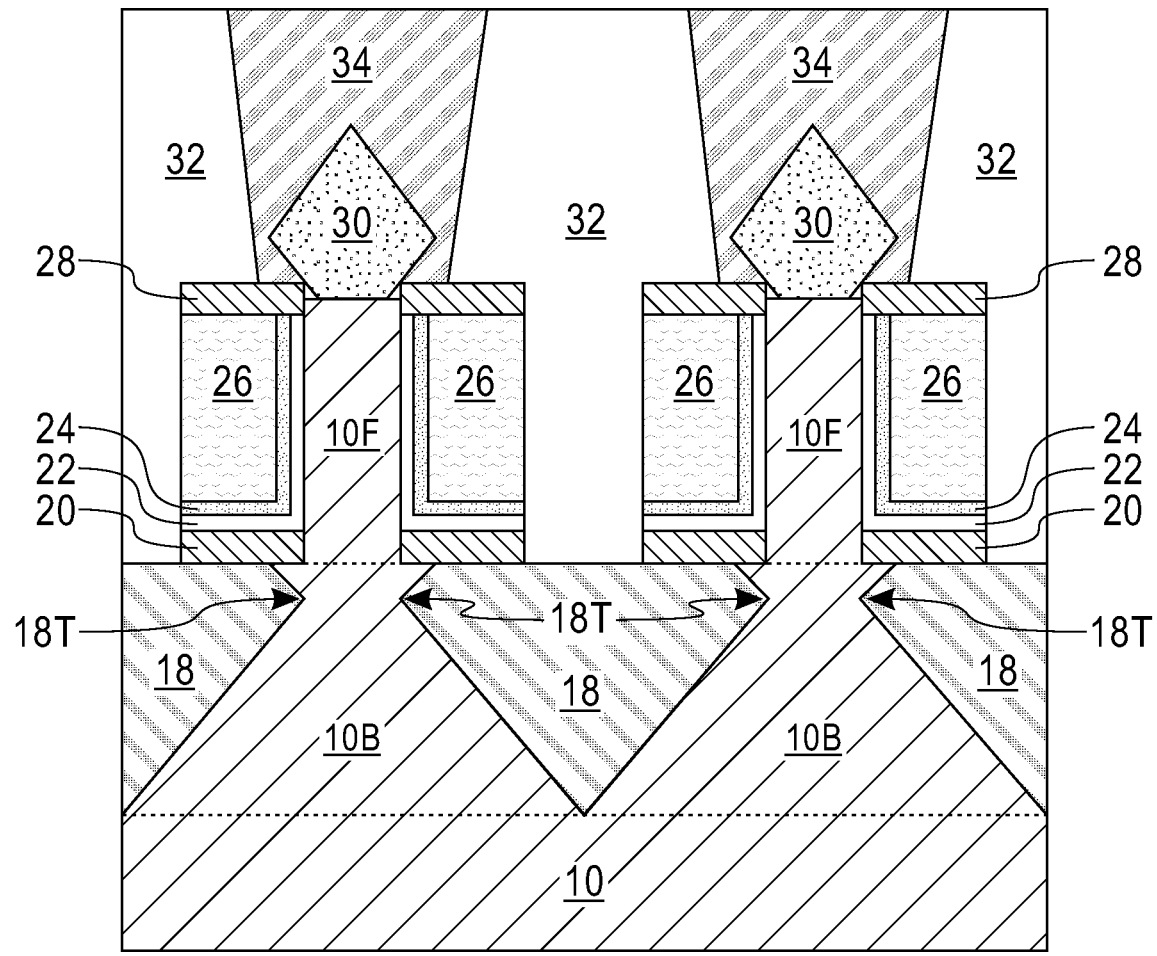
FIG. 11 is a cross sectional view of the exemplary semiconductor structure of FIG. 10 after forming additional components of a vertical transistor.

Referring now to FIG. 11, there is illustrated the exemplary semiconductor structure of FIG. 10 after forming additional components of a vertical transistor. The additional components of the vertical transistor include a bottom spacer 20, a gate structure comprising a gate dielectric material layer 22, an optional work function metal layer 24, and a gate conductor 26, a top spacer 28, a top source/drain structure 30, a middle-of-the line dielectric (MOL) dielectric material 32 and a top source/drain contact structure 34. The additional components of the vertical transistor of this embodiment of the present application are the same as those described above in the previous embodiment of the present application.

FIG. 11 shows another exemplary semiconductor structure of the present application. Notably, the exemplary structure of FIG. 11 is a vertical transistor structure that includes at least one semiconductor fin 10F extending upwards from a semiconductor base 10B of a semiconductor substrate 10, wherein the semiconductor base 10B comprises an upper portion, a lower portion and a midsection 16, wherein the midsection 16 has a narrower width than the lower and upper portions. A bottom source/drain structure 18 is located on surfaces of the semiconductor substrate 10 and surfaces of semiconductor base 10. The bottom source/drain structure 18 has a tip region 18T that contacts the midsection 16 of the semiconductor base 10B. A gate structure (22, optionally 24, 26) is located above the bottom source/drain structure 18 and on each side of the at least one semiconductor fin 10. A top source/drain structure 30 is located on a topmost surface of the at least one semiconductor fin 10F.

Figure 12:
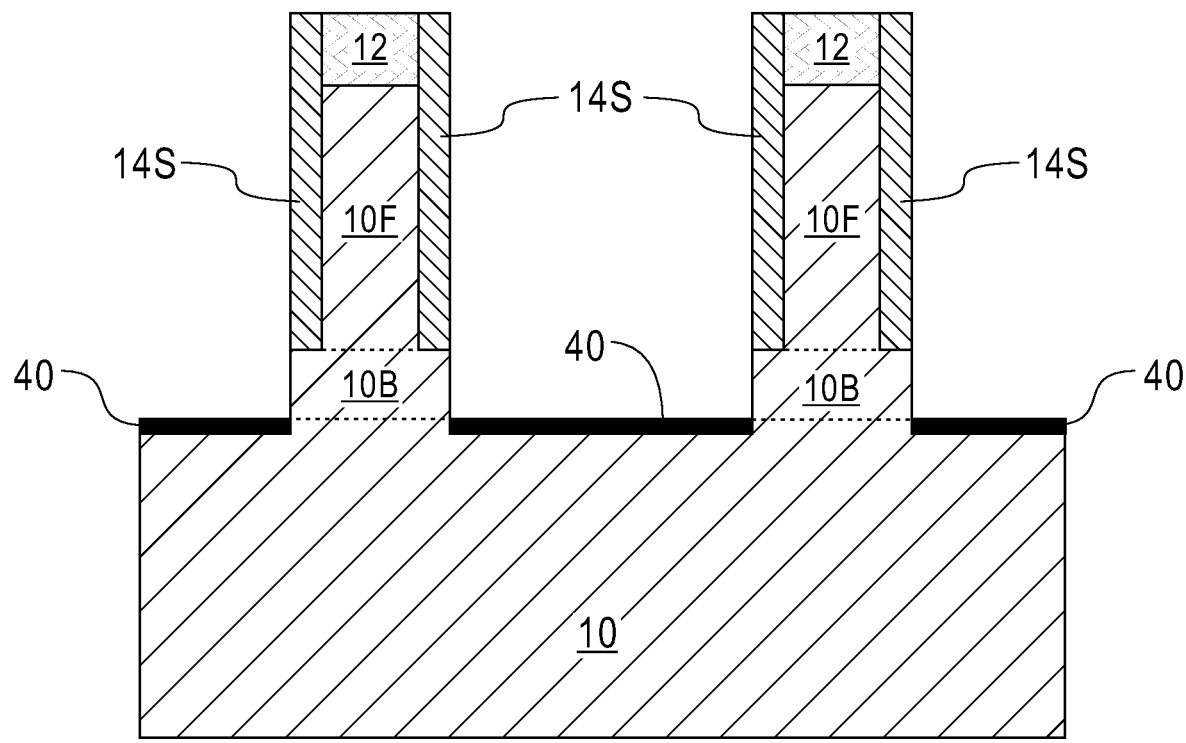
FIG. 12 is a cross sectional view of the exemplary semiconductor structure of FIG. 5A after formation of an implant region that is resistance to the self-limiting etch in an upper portion of the semiconductor substrate in accordance with a yet other embodiment of the present application.

Referring now to FIG. 12, there is illustrated the exemplary semiconductor structure of FIG. 5A after formation of implant region 40 that is resistance to the self-limiting etch in an upper portion of the semiconductor substrate 10 in accordance with a yet other embodiment of the present application. The implant region 40 includes the same semiconductor material as the semiconductor substrate and a dopant that provides that provides a doped semiconductor material that is resistant to the self-limiting etch. In one example, the implant region 40 includes boron doped silicon. The implant region 40 can be formed utilizing an ion implantation process. The implant region 40 may can a dopant concentration in a range from $1\times10^{17}$ atoms/cm$^3$ to $1\times10^{19}$ atoms/cm$^3$. The implant region 40 may be formed to a depth from 5 nm to 20 nm below the initial recessed surface of the semiconductor substrate 10 that is provided in FIG. 5A.

Figure 13:
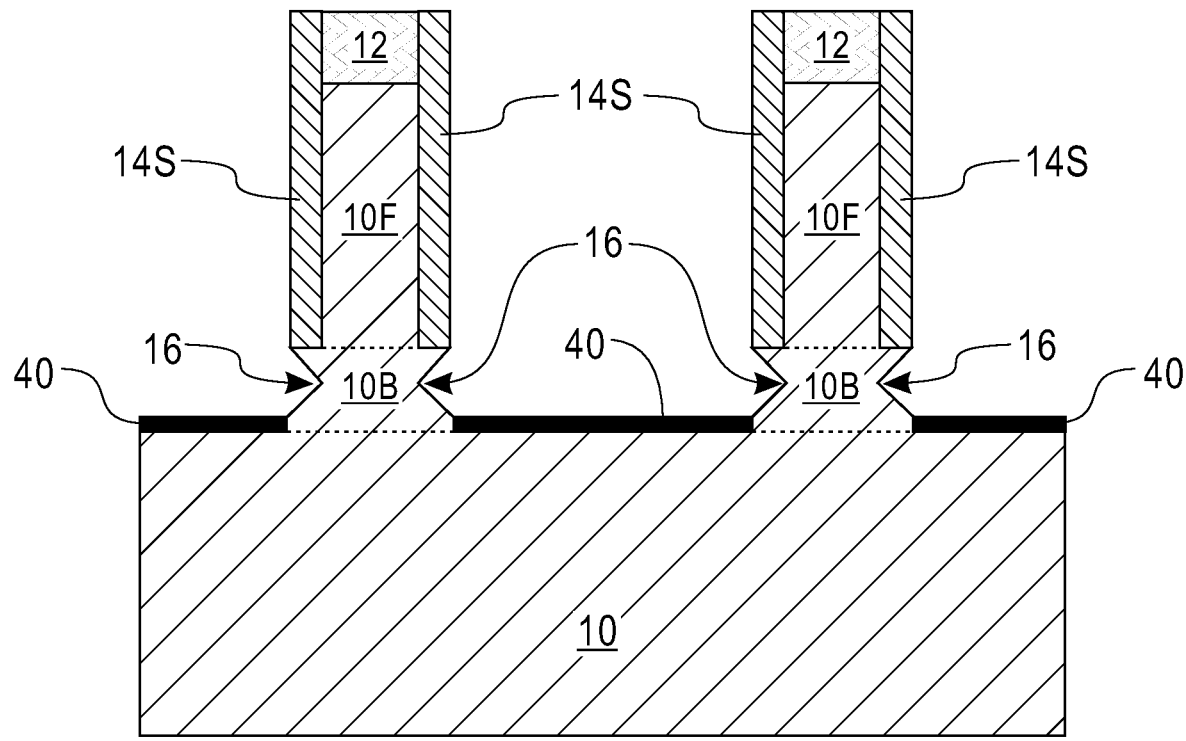
FIG. 13 is a cross sectional view of the exemplary semiconductor structure of FIG. 12 after performing the self-limiting etch.

Referring now to FIG. 13, there is illustrated the exemplary semiconductor structure of FIG. 12 after performing the self-limiting etch. The presence of the implant region 40 prevents etching of the initial recessed surface of the semiconductor substrate 10 that is provided in FIG. 5A. The self-limiting etch is the same as that described above in providing the exemplary structure shown in FIG. 6A of the present application. Thus, self-limiting etch forms semiconductor base 10B having a hourglass shape having midsection 16. In this embodiment, the semiconductor base 10B is composed mainly of the semiconductor pedestal 10P.

Figure 14:
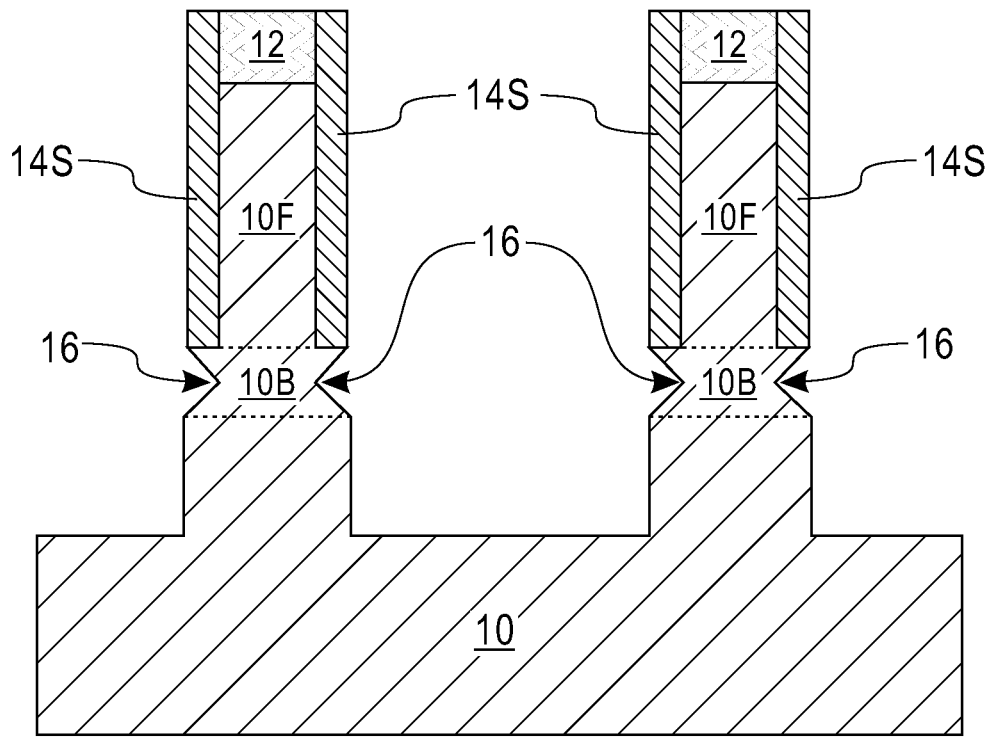
FIG. 14 is a cross sectional view of the exemplary semiconductor structure of FIG. 13 after performing a second recessing of the semiconductor substrate.

Referring now to FIG. 14, there is illustrated the exemplary semiconductor structure of FIG. 13 after performing a second recessing of the semiconductor substrate 10. The second recessing of the semiconductor substrate 10 removes the implant region 40 as well as portion of the remaining semiconductor substrate 10. The second recessing of the semiconductor substrate 10 may be preferred utilizing an etch as described above for the embodiment in which a second recessing was performed.

Figure 15:
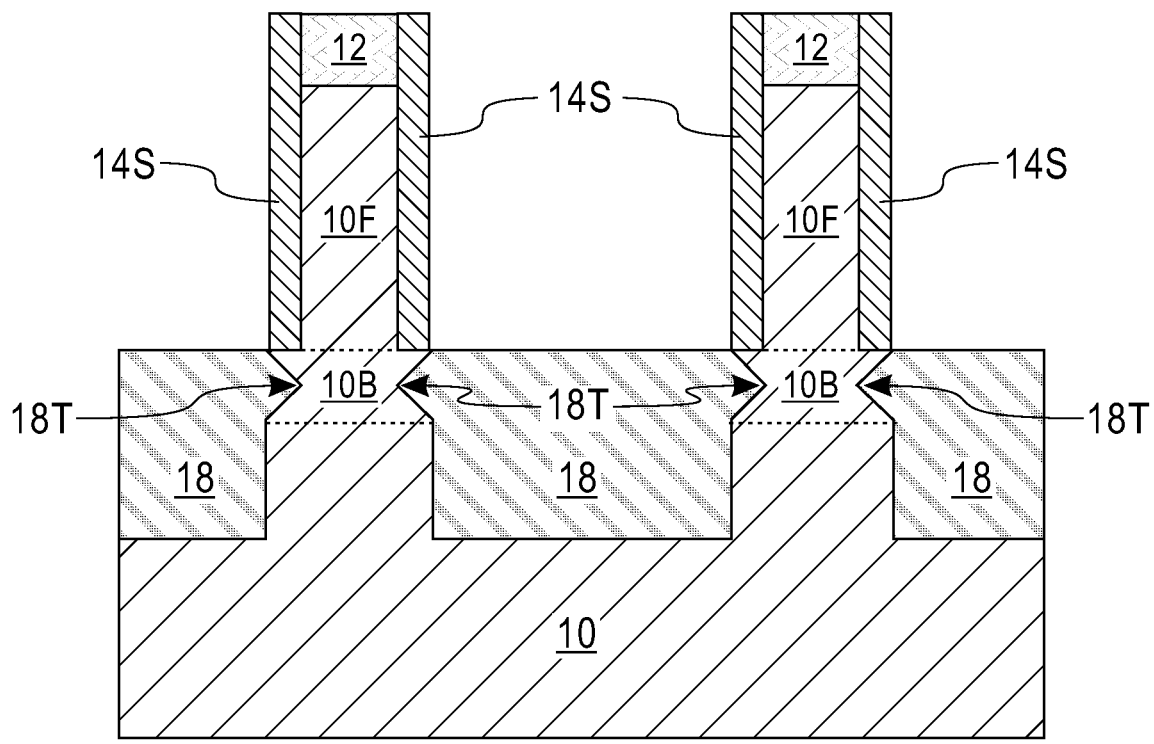
FIG. 15 is a cross sectional view of the exemplary semiconductor structure of FIG. 14 after formation of the bottom source/drain structure.

Referring now to FIG. 15, there is illustrated the exemplary semiconductor structure of FIG. 14 after formation of the bottom source/drain structure in accordance with an alternative embodiment of the present application. The bottom source/drain structure 18 of this embodiment of the present application is the same as that described above in FIG. 8 of the present application. Thus, the bottom source/drain structure 18 of this embodiment of the present application includes a semiconductor material and dopant as described above in the previous embodiment of the present application. The bottom source/drain structure 18 of this embodiment of the present application can be formed utilizing an epitaxial growth process as described above for forming the bottom source/drain structure 18 in the previous embodiment of the present application.

Figure 16:
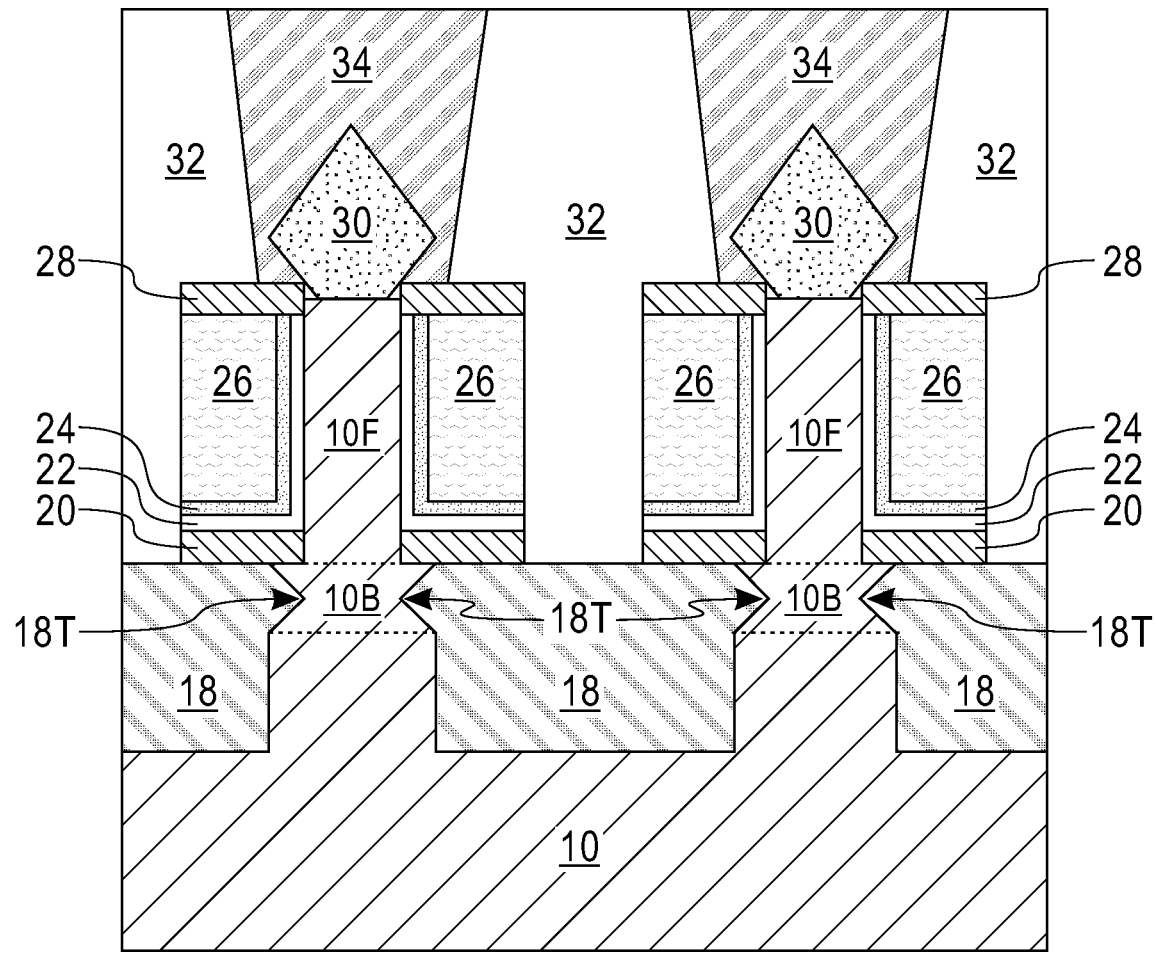
FIG. 16 is a cross sectional view of the exemplary semiconductor structure of FIG. 15 after forming additional components of a vertical transistor.

Referring now to FIG. 16, there is illustrated the exemplary semiconductor structure of FIG. 15 after forming additional components of a vertical transistor. The additional components of the vertical transistor include a bottom spacer 20, a gate structure comprising a gate dielectric material layer 22, an optional work function metal layer 24, and a gate conductor 26, a top spacer 28, a top source/drain structure 30, a middle-of-the line dielectric (MOL) dielectric material 32 and a top source/drain contact structure 34. The additional components of the vertical transistor of this embodiment of the present application are the same as those described above in the previous embodiment of the present application.

FIG. 16 shows a further exemplary semiconductor structure of the present application. Notably, the exemplary structure of FIG. 16 is a vertical transistor structure that includes at least one semiconductor fin 10F extending upwards from a semiconductor base 10B of a semiconductor substrate 10, wherein the semiconductor base 10B comprises an upper portion, a lower portion and a midsection 16, wherein the midsection 16 has a narrower width than the lower and upper portions. A bottom source/drain structure 18 is located on surfaces of the semiconductor substrate 10 and surfaces of semiconductor base 10. The bottom source/drain structure 18 has a tip region 18T that contacts the midsection 16 of the semiconductor base 10B. A gate structure (22, optionally 24, 26) is located above the bottom source/drain structure 18 and on each side of the at least one semiconductor fin 10. A top source/drain structure 30 is located on a topmost surface of the at least one semiconductor fin 10F.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one semiconductor fin extending upwards from a semiconductor base of a semiconductor substrate, wherein the semiconductor base comprises an upper portion, a lower portion and a midsection, wherein the midsection has a narrower width than the lower and upper portions;
   a bottom source/drain structure located on the semiconductor substrate and contacting the midsection of the semiconductor base;
   a gate structure located on top of the bottom source/drain structure and on each side of the at least one semiconductor fin; and
   a top source/drain structure located on a topmost surface of the at least one semiconductor fin.

2. The semiconductor structure of claim 1, wherein the gate structure comprises a gate dielectric material layer and a gate conductor, wherein the gate dielectric material layer directly contacts sidewall surfaces of the at least one semiconductor fin, and the gate conductor is located on the gate dielectric material layer.

3. The semiconductor structure of claim 2, wherein the gate structure further comprises a work function metal layer located between the gate dielectric material layer and the gate conductor.

4. The semiconductor structure of claim 1, further comprising a bottom spacer located between the gate structure and the bottom source/drain structure, wherein the bottom spacer contacts a lower portion of the least one semiconductor fin.

5. The semiconductor structure of claim 4, further comprising a top spacer located on a topmost surface of the gate structure and contacting an upper portion of the least one semiconductor fin.

6. The semiconductor structure of claim 1, wherein the semiconductor substrate has a concave surface.

7. The semiconductor structure of claim 1, wherein the top source/drain structure has a faceted surface.

8. The semiconductor structure of claim 7, wherein the top source/drain structure has a diamond shape.

9. The semiconductor structure of claim 1, further comprising a middle-of-the-line (MOL) dielectric material laterally surrounding the gate structure, the semiconductor fin and the top source/drain contact.

10. The semiconductor structure of claim 9, further comprising a source/drain contact contacting each of the top source/drain structure and the bottom source/drain structure.

11. A method of forming a semiconductor structure, the method comprising:
    forming at least one semiconductor fin extending upwards from a semiconductor base, wherein the semiconductor base is located on a semiconductor substrate and comprises an upper portion, a lower portion and a midsection, wherein the midsection has a narrower width than the lower and upper portions;
    forming a bottom source/drain structure on physically exposed surfaces of the semiconductor base and the semiconductor substrate;
    forming a gate structure on top of the bottom source/drain structure and on each side of the at least one semiconductor fin; and
    forming a top source/drain structure on a topmost surface of the at least one semiconductor fin.

12. The method of claim 11, wherein the semiconductor base is formed by recessing the semiconductor substrate to provide a semiconductor pedestal beneath the at least one semiconductor fin, and performing a self-limiting etch on semiconductor pedestal.

13. The method of claim 12, wherein the self-limiting etch comprises a sigma etch.

14. The method of claim 12, further comprising performing a second recessing of the semiconductor substrate after the performing of the self-limiting etch and prior to the forming of the bottom source/drain structure.

15. The method of claim 12, further comprising forming an implant region in the semiconductor substrate after the recessing of the semiconductor substrate and prior to the performing of the self-limiting etch, wherein the implant region prevents etching of the semiconductor substrate during the self-limiting etch.

16. The method of claim 15, further comprising performing a second recessing of the semiconductor substrate after the performing of the self-limiting etch and prior to the forming of the bottom source/drain structure, wherein the second recessing removes the implant region and a portion of the semiconductor substrate.

17. The method of claim 11, wherein the bottom source/drain structure and the top source/drain structure are formed by an epitaxial growth process.

18. The method of claim 11, further comprising forming a bottom spacer located on the bottom source/drain structure prior to the forming the gate structure.

19. The method of claim 18, further comprising forming a top spacer located on a topmost surface of the gate structure prior to forming the top source/drain structure.

20. The method of claim 11, wherein the forming the gate structure comprises forming a gate dielectric material layer and a gate conductor, wherein the gate dielectric material layer directly contacts sidewall surfaces of the at least one semiconductor fin.

* * * * *